US006507223B2

(12) United States Patent
Felder

(10) Patent No.: US 6,507,223 B2
(45) Date of Patent: Jan. 14, 2003

(54) DIFFERENTIAL LINE DRIVER HAVING ADJUSTABLE COMMON MODE OPERATION

(75) Inventor: Matthew D. Felder, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 09/790,780

(22) Filed: Feb. 22, 2001

(65) Prior Publication Data

US 2002/0113626 A1 Aug. 22, 2002

(51) Int. Cl.[7] ................................................ H03K 5/22
(52) U.S. Cl. .................... 327/77; 327/108; 327/563; 326/82; 330/69
(58) Field of Search ................................. 327/108, 379, 327/561, 563, 77–79, 74, 52, 63, 67; 326/82, 30, 86; 330/69, 158

(56) References Cited

U.S. PATENT DOCUMENTS

| | | | | |
|---|---|---|---|---|
| 6,014,054 A | * | 1/2000 | Kawakita et al. | 327/563 |
| 6,097,245 A | * | 8/2000 | Dobbelaere et al. | 327/560 |
| 6,100,717 A | * | 8/2000 | May | 326/83 |
| 6,259,300 B1 | * | 7/2001 | Yasuda et al. | 327/563 |
| 6,373,277 B1 | * | 4/2002 | Felder | 326/82 |

OTHER PUBLICATIONS

Timeless Ideas for Design–Jul. 10, 2000 (originally published Mar. 6, 1995)—"Positive Feedback Terminates Cables", by Jerry Steele, National Semiconductor Corp., Tucson Design Center, 940 Finance Center Dr. Suuite 120, Tucson, AZ 85710.

* cited by examiner

Primary Examiner—Terry D. Cunningham
Assistant Examiner—Long Nguyen
(74) Attorney, Agent, or Firm—Timothy W. Markison

(57) ABSTRACT

A differential line driver that includes a $1^{st}$ operational amplifier, a $2^{nd}$ operational amplifier, an adjustable reference module, a $1^{st}$ feedback impedance, and a $2^{nd}$ feedback impedance. First inputs (e.g. the inverting input or non-inverting input) of the $1^{st}$ and $2^{nd}$ operational amplifiers are coupled to receive an input signal. The $2^{nd}$ inputs (e.g. the compliment of the $1^{st}$ input) of the $1^{st}$ and $2^{nd}$ operational amplifiers are operably coupled to receive an adjustable reference voltage from the adjustable reference module. The adjustable reference module provides the adjustable reference voltage based on the common mode of the power source for the $1^{st}$ and $2^{nd}$ operational amplifiers (e.g. $V_{dd}$, $V_{ss}$) and/or the common mode of the input signal. The $1^{st}$ and $2^{nd}$ feedback impedances, (e.g. resistors) are coupled from the output of the respective operational amplifiers to either the $1^{st}$ or $2^{nd}$ input of the respective operational amplifiers.

14 Claims, 4 Drawing Sheets

40

DIFFERENTIAL LINE DRIVER HAVING ADJUSTABLE COMMON MODE OPERATION

TECHNICAL FIELD OF THE INVENTION

This invention relates generally to data transmission and more particularly to line drivers used in such data transmissions.

BACKGROUND OF THE INVENTION

Line drivers are known to receive an input signal and amplify its power to drive a transmission line. The transmission line may be used in a telecommunication system, computer system, and/or any data transmission path wherein the path includes the characteristics of a transmission line. For an SHDSL (symmetrical high-speed digital subscriber line) system, the line driver receives the transmission data, produces a drive signal that has a peak-to-peak level of up to 20-volts, and drives a 135 ohm transmission line. The basic architecture of a line driver will consume a significant amount of power to achieve this performance level.

Techniques have been developed to reduce the power consumption of such line drivers. One technique is to increase the output swing of the line driver because the greater the output swing (e.g., approaching the rail voltages $V_{dd}$ and $V_{ss}$) without clipping, the less power the line driver consumes and the more efficient it is. As is known, to improve the output swing, a common mode control circuit is used to produce a controlled common mode voltage.

While regulating the common mode output voltage reduces power consumption of the line driver, it does not compensate for voltage differences between the input of the line driver and the output of the line driver. As is known, the output of the line driver operates at higher voltages than the rest of the modem circuitry, which provides the input to the line driver. The difference in operating voltages requires a level shift if the line driver is DC coupled to the modem circuitry, which typically requires additional circuitry. To avoid the use of the additional level shifting circuitry, the line driver may be capacitively coupled to the modem circuitry. But this presents it own set of problems in that the capacitive coupling is done via an external capacitor with respect to an integrated circuit line driver. The external capacitor adds extra cost and consumes precious circuit board space.

Therefore, a need exists for a line driver that has tightly controlled common mode voltages to provide maximum output swing of the line driver, thereby improving the overall efficiency of such a line driver.

DETAILED DESCRIPTION OF A PREFERRED EMBODIMENT

Generally, the present invention provides a differential line driver that includes a $1^{st}$ operational amplifier, a $2^{nd}$ operational amplifier, an adjustable reference module, a $1^{st}$ feedback impedance, and a $2^{nd}$ feedback impedance. First inputs (e.g. the inverting input or non-inverting input) of the $1^{st}$ and $2^{nd}$ operational amplifiers are coupled to receive an input signal. The $2^{nd}$ inputs (e.g. the compliment of the $1^{st}$ input) of the $1^{st}$ and $2^{nd}$ operational amplifiers are operably coupled to receive an adjustable reference voltage from the adjustable reference module. The adjustable reference module provides the adjustable reference voltage based on the common mode of the power source for the $1^{st}$ and $2^{nd}$ operational amplifiers (e.g. $V_{dd}$, $V_{ss}$) and/or the common mode of the input signal. The $1^{st}$ and $2^{nd}$ feedback impedances, (e.g. resistors) are coupled from the output of the respective operational amplifiers to either the $1^{st}$ or $2^{nd}$ input of the respective operational amplifiers. With such a differential line driver, a maximum output swing is provided by using a tightly controlled common mode voltage, which improves the overall efficiency of such a line driver. Accordingly, the line driver's output swings as close to the rails as possible since the adjustable reference voltage centers the common mode voltage with respect to the positive and negative rails ($V_{dd}$, $V_{ss}$) and/or the common mode of the input signal.

Figure 1:
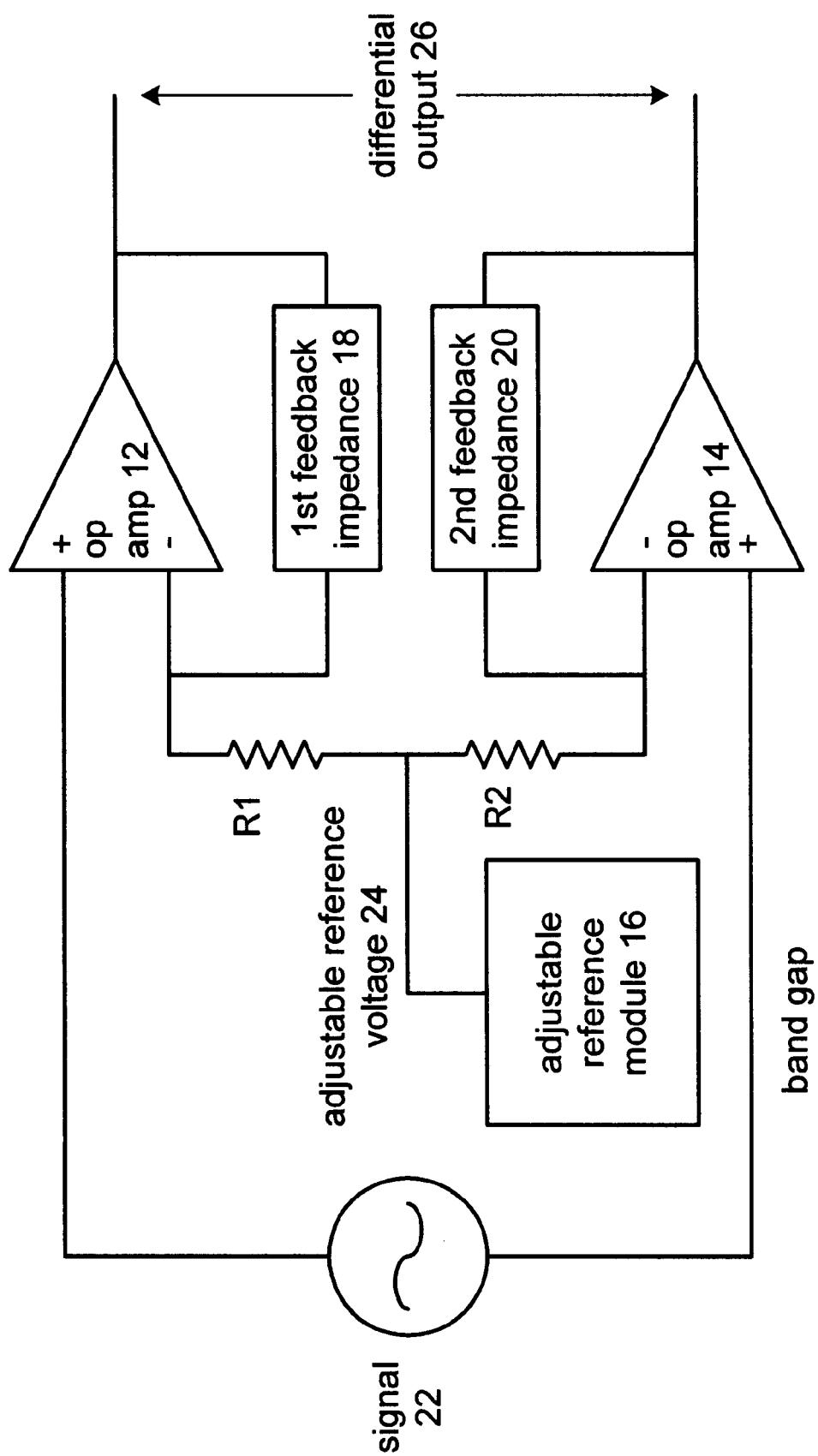
FIG. 1 illustrates a schematic block diagram of a differential line driver in accordance with the present invention.

The present invention can be more fully described with reference to FIGS. 1 through 4. FIG. 1 illustrates a schematic block diagram of a differential line driver 10 in accordance with the present invention. The differential line driver 10 includes a $1^{st}$ operational amplifier 12, a $2^{nd}$ operational amplifier 14, an adjustable reference module 16, a $1^{st}$ feedback impedance 18, a $2^{nd}$ feedback impedance 20, a signal source 22, and resistors R1 and R2. As shown, the adjustable reference module 16 produces an adjustable reference voltage 24, which is provided to an input of both the $1^{st}$ and $2^{nd}$ operational amplifiers 12 and 14 via resistors R1 and R2. The adjustable reference module 16 produces the adjustable reference voltage 24 based on the common mode voltage of signal 22 and/or based on the common mode voltage of the supply voltage sourcing power to operational amplifiers 12 and 14. The adjustable reference module 16 will be described in greater detail with reference to FIG. 3.

The other inputs of the $1^{st}$ and $2^{nd}$ operational amplifiers are operably coupled to receive the differential signal 22. The $1^{st}$ and $2^{nd}$ feedback impedances 18 and 20 are operably coupled to the respective operational amplifiers 12 and 14 as shown. In this configuration, a differential output 26 is produced via the outputs of the $1^{st}$ and $2^{nd}$ operational amplifiers. Note that the $1^{st}$ and $2^{nd}$ feedback impedances 18 and 20 may be resistors.

The signal 22 may be generated by the output of a digital to analog converter for use in an analog front end of a telecommunication modem. Such a modem may be an ADSL modem, SHDSL modem, UADSL modem, et cetera. The line driver circuit therefore, drives a twisted pair to transport the signal generated by a modem to a corresponding central office.

Figure 2:
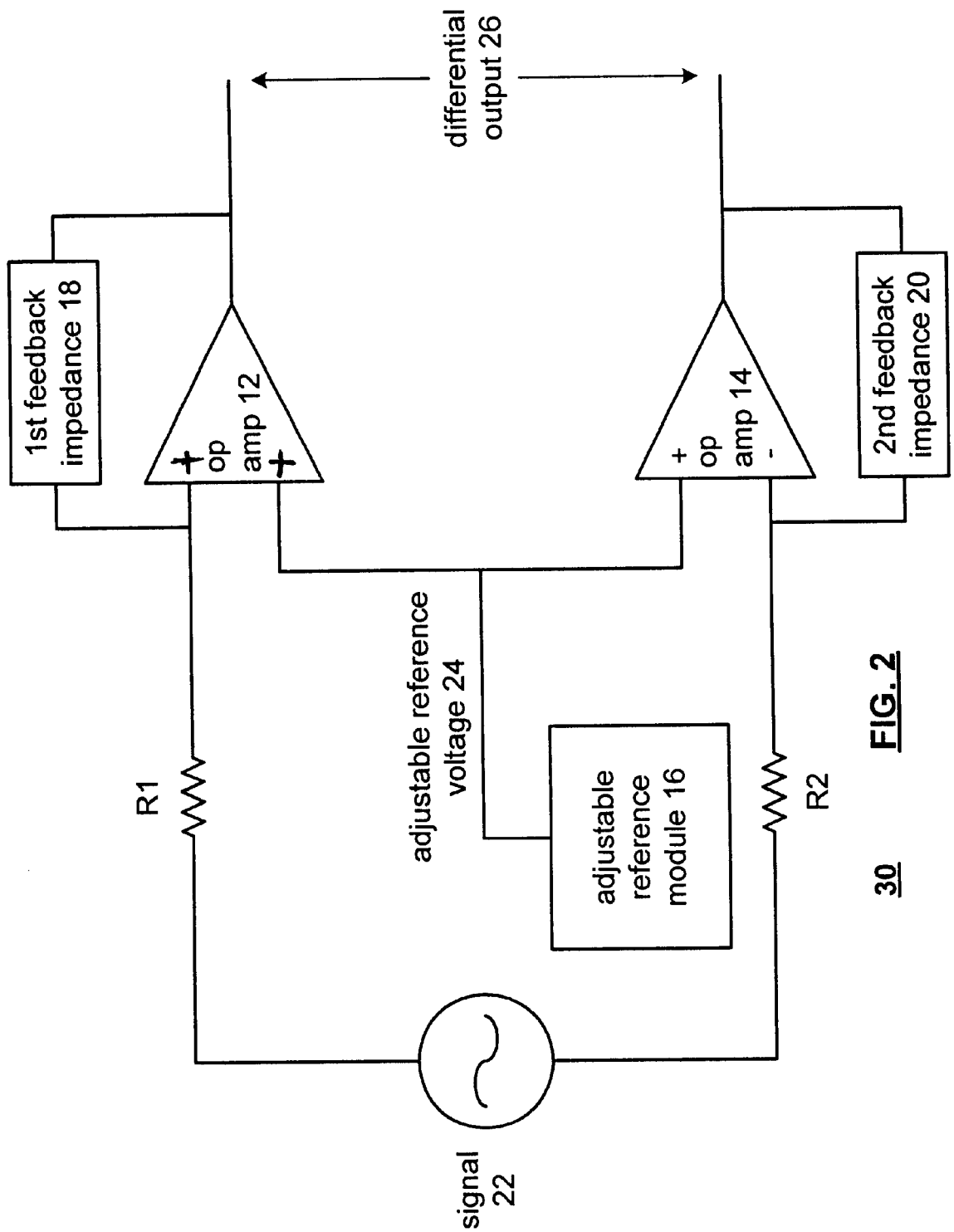
FIG. 2 illustrates a schematic block diagram of an alternate differential line driver in accordance with the present invention.

FIG. 2 illustrates a schematic block diagram of an alternate differential line driver 30 in accordance with the present invention. In this embodiment, the differential line driver 30 includes the same components, i.e. the $1^{st}$ and $2^{nd}$ operational amplifiers 12 and 14, the adjustable reference module 16, the $1^{st}$ and $2^{nd}$ impedances 18 and 20, the signal source 22, and resistors R1 and R2. In this embodiment, the $1^{st}$ and $2^{nd}$ feedback impedances 18 and 20 are operably coupled to the inputs of the operational amplifiers that also receive the signal 22 via resistors R1 and R2. The outputs of the $1^{st}$ and $2^{nd}$ operational amplifiers 12 and 14 produce the differential output 26. The differential line driver 30 may be used in similar applications as the differential line driver 10 of FIG. 1.

Figure 3:
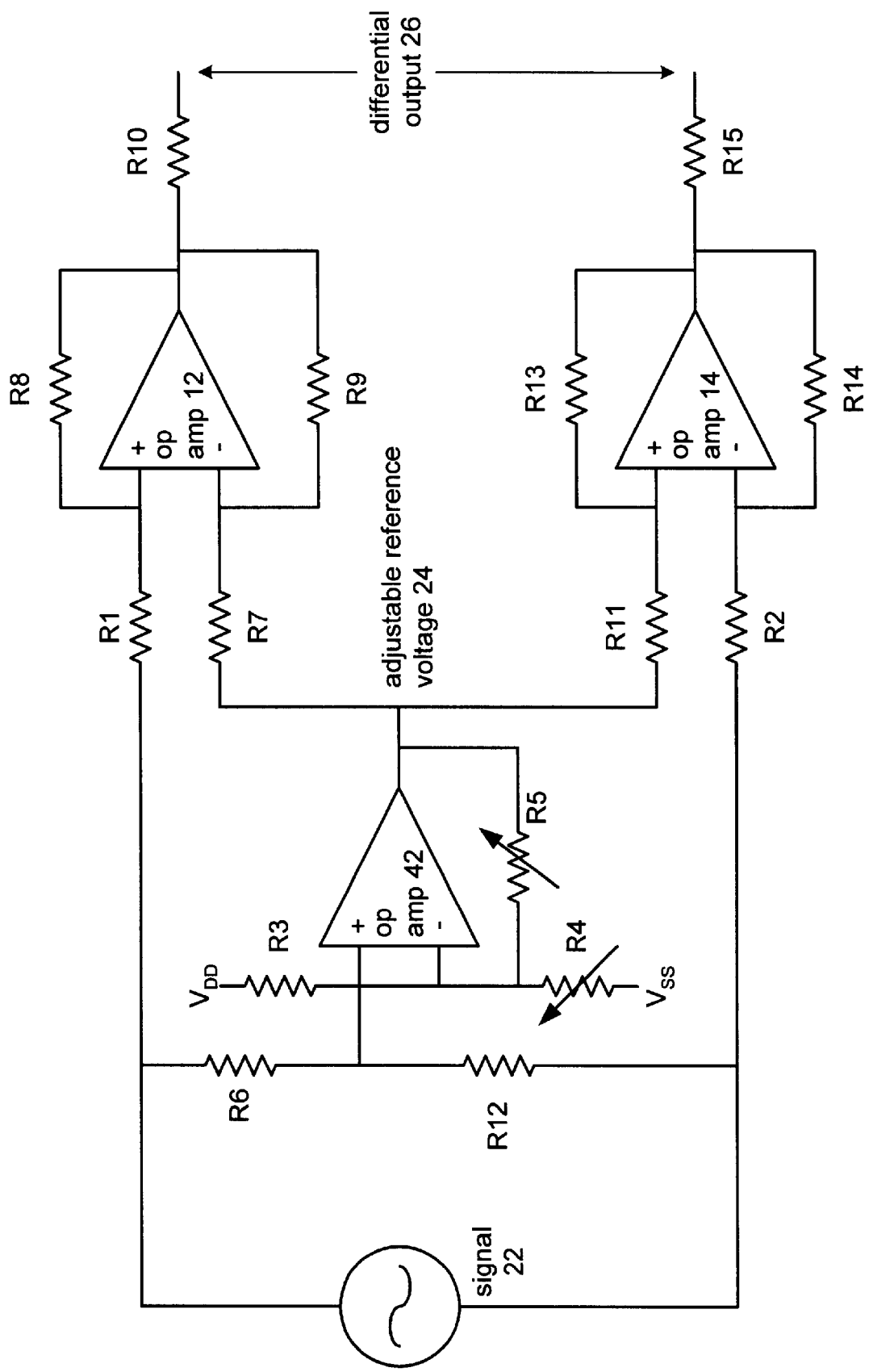
FIG. 3 illustrates a schematic block diagram of another differential line driver in accordance with the present invention.

FIG. 3 illustrates a schematic block diagram of a differential line driver 40 in accordance with the present invention. In this embodiment, the differential line driver 40 includes the $1^{st}$ and $2^{nd}$ operational amplifiers 12 and 14, a $3^{rd}$ operational amplifier 42, the signal source 22 and a plurality of resistors. The $1^{st}$ and $2^{nd}$ operational amplifiers 12 and 14 are operably coupled via resistor R1 and resistor R2 to receive the signal 22. The complimentary inputs of operational amplifier 12 and 14 are operably coupled via resistor R7 and resistor R11 to receive the adjustable reference voltage 24.

The $3^{rd}$ operational amplifier 42 produces the adjustable reference voltage 24. As shown, a $1^{st}$ input of the operational amplifier 42 receives an input from a common mode line module, which includes a resistive divider R3 and R4. The second input of the operational amplifier 42 may be coupled to a reference voltage or to a common mode signal module that includes resistors R6 and R12. The common mode signal module produces a common mode representation of signal 22 via resistors R6 and R12. The common mode line module, via resistors R3 and R4, provide a common mode representation of the power source ($V_{dd}$, $V_{ss}$). Note that resistor R4 is variable such that the common mode of the line (i.e. the power source) may be varied. The varying of resistor R4 may be done utilizing a table lookup and/or a feedback system. The feedback system would monitor the differential output with respect to the rails of the line ($V_{dd}$ and $V_{ss}$). If the output swing is skewed towards one rail or the other, the feedback system would adjust resistor R4 to center the differential output between the rails of the supply.

In this embodiment, the adjustable reference module 16 of FIG. 1 and FIG. 2 includes the $3^{rd}$ operational amplifier, the feedback resistor R5, which may be variable, the common mode signal module (R6 and R12), and the common mode line module (R3 and R4). As one of average skill in the art will appreciate, the adjustable reference module 16 may include either of the common mode modules or both.

The $1^{st}$ and $2^{nd}$ operational amplifiers include feedback resistors R8, R9, R13 and R14, which provide the gain for the respective operational amplifier. Resistors 10 and 15 represent impedance matching elements to match the line being driven. As one of average skill in the art will appreciate, the sizing of the resistor elements depends on the particular application. One of average skill in the art will further appreciate that the operational amplifier 42 may be replaced by a band-gap reference wherein one of the input components to the band-gap reference is variable to produce the adjustable reference voltage 24.

Figure 4:
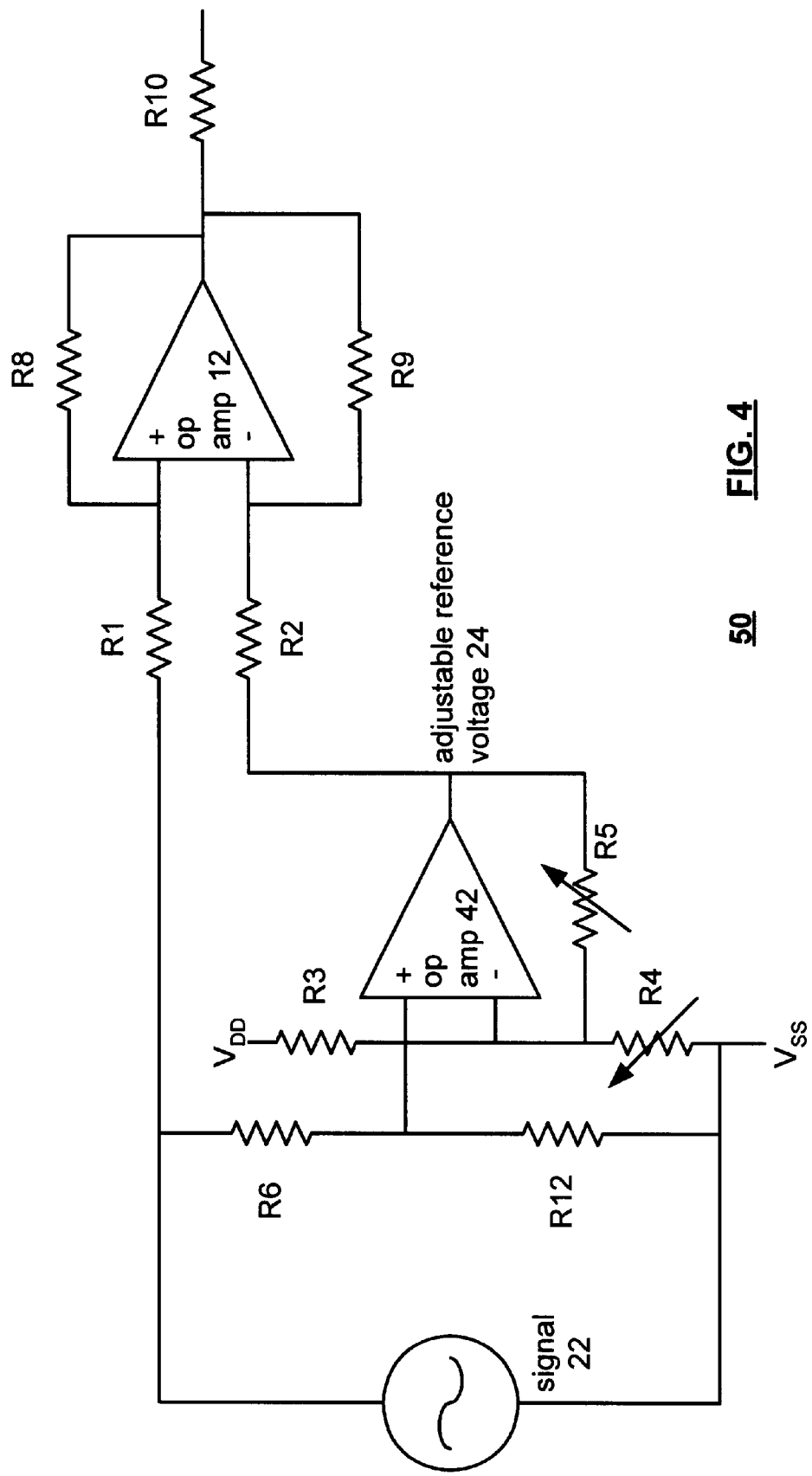
FIG. 4 illustrates a schematic block diagram of a line driver in accordance with the present invention.

FIG. 4 illustrates a schematic block diagram of a single ended line driver 50. In this embodiment, the $1^{st}$ operational amplifier 12 has $1^{st}$ and $2^{nd}$ inputs coupled to receive the signal 22 and the adjustable reference voltage 24 via resistors R1 and R2. The output of the operational amplifier 12 is coupled via resistor R10. Feedback is provided via resistors R8 and R9. The functionality of the adjustable reference module 16 includes the operational amplifier 42 and the common mode line module, which is represented by resistive divider R3 and R4, and the common mode signal module, which is represented by R6 and R12. In this embodiment, the signal 22 is also coupled to the return voltage ($V_{ss}$) of the supply and the common mode of the operational amplifier 12 is adjusted based on the single ended common mode of the signal 22. As such, the output DC level of operational amplifier 12 can be adjusted to provide the desired swing as with the differential line drivers described above. As one of average skill in the art will appreciate, R4 and R5 in any of the embodiments described herein may be fixed resistances, such that the reference module 16 provides a fixed reference voltage 24.

The preceding discussion has presented a line driver that includes impedance synthesis and common mode adjustments such that the output swing of the line driver can be maximized to improve the overall performance of the line driver. As one of average skill in the art will appreciate, other embodiments may be derived from the teachings of the present invention without deviating from the scope of the claims.

What is claimed is:

1. A differential line driver comprises:

first operational amplifier having a first input, a second input, and an output;

second operational amplifier having a first input, a second input, and an output, wherein the first inputs of the first and second operational amplifiers are operably coupled to receive a signal;

adjustable reference module that produces an adjustable reference voltage, wherein the second inputs of the first and second operational amplifiers are operably coupled to receive the adjustable reference voltage;

first feedback impedance operably coupled to the second input and the output of the first operational amplifier; and second feedback impedance operably coupled to the second input and the output of the second operational amplifier, such that the outputs of the first and second operational amplifiers provide a differential output.

2. The differential line driver of claim 1, wherein the adjustable reference module further comprises:

third operational amplifier having a first input, a second input, and an output;

common mode line module operably coupled to provide a common mode voltage of a power supply, wherein the first input of the third operational amplifier is operably coupled to receive the common mode voltage; and feedback impedance operably coupled between the second input and the output of the third operational amplifier.

3. The differential line driver of claim 2, wherein the common mode line module further comprises:

an adjustable voltage divider operably coupled between a first source of the power supply and a second source of the power supply, wherein a tap of the voltage divider provides the common mode voltage.

4. The differential line driver of claim 1, wherein the adjustable reference module further comprises:

third operational amplifier having a first input, a second input, and an output;

common mode signal module operably coupled to provide a common mode voltage of the signal, wherein the first input of the third operational amplifier is operably coupled to receive the common mode voltage; and feedback impedance operably coupled between the second input and the output of the third operational amplifier.

5. The differential line driver of claim 4, wherein the common mode signal module further comprises:

an adjustable voltage divider operably coupled between a first node of the signal and a second node of the signal, wherein a tap of the voltage divider provides the common mode voltage.

6. The differential line driver of claim 1, wherein the adjustable reference module further comprises a band-gap voltage source that provides the adjustable reference voltage.

7. The differential line driver of claim 1 further comprises impedance matching elements coupled to outputs of first and second operational amplifiers.

8. A differential line driver comprises:

first operational amplifier having a first input, a second input, and an output;

second operational amplifier having a first input, a second input, and an output, wherein the first inputs of the first and second operational amplifiers are operably coupled to receive a signal;

adjustable reference module that produces an adjustable reference voltage, wherein the second inputs of the first and second operational amplifiers are operably coupled to receive the adjustable reference voltage;

first feedback impedance operably coupled to the first input and the output of the first operational amplifier; and second feedback impedance operably coupled to the first input and the output of the second operational amplifier, such that the outputs of the first and second operational amplifiers provide a differential output.

9. The differential line driver of claim 8, wherein the adjustable reference module further comprises:

third operational amplifier having a first input, a second input, and an output;

common mode line module operably coupled to provide a common mode voltage of a power supply, wherein the first input of the third operational amplifier is operably coupled to receive the common mode voltage; and feedback impedance operably coupled between the second input and the output of the third operational amplifier.

10. The differential line driver of claim 9, wherein the common mode line module further comprises:

an adjustable voltage divider operably coupled between a first source of the power supply and a second source of the power supply, wherein a tap of the voltage divider provides the common mode voltage.

11. The differential line driver of claim 8, wherein the adjustable reference module further comprises:

third operational amplifier having a first input, a second input, and an output;

common mode signal module operably coupled to provide a common mode voltage of the signal, wherein the first input of the third operational amplifier is operably coupled to receive the common mode voltage; and feedback impedance operably coupled between the second input and the output of the third operational amplifier.

12. The differential line driver of claim 11, wherein the common mode signal module further comprises:

an adjustable voltage divider operably coupled between a first node of the signal and a second node of the signal, wherein a tap of the voltage divider provides the common mode voltage.

13. The differential line driver of claim 8, wherein the adjustable reference module further comprises a band-gap voltage source that provides the adjustable reference voltage.

14. The differential line driver of claim 8 further comprises impedance matching elements coupled to outputs of first and second operational amplifiers.

* * * * *